(12) United States Patent
Götz et al.

(10) Patent No.: US 10,054,644 B2
(45) Date of Patent: Aug. 21, 2018

(54) METHOD AND APPARATUS FOR LOCATING A BATTERY MODULE AMONG MULTIPLE BATTERY MODULES OF A TRACTION BATTERY THAT ARE ELECTRICALLY CONNECTED TO ONE ANOTHER

(71) Applicant: Dr. Ing. h.c. F. Porsche Aktiengesellschaft, Stuttgart (DE)

(72) Inventors: Stefan Götz, Forstern (DE); Hermann Dibos, Remchingen (DE); Malte Jaensch, Bietigheim-Bissingen (DE)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 49 days.

(21) Appl. No.: 15/198,157

(22) Filed: Jun. 30, 2016

(65) Prior Publication Data
US 2017/0010330 A1     Jan. 12, 2017

(30) Foreign Application Priority Data
Jul. 8, 2015    (DE) .................. 10 2015 111 015

(51) Int. Cl.
*G01R 31/25*      (2006.01)
*G01R 31/36*      (2006.01)
(Continued)

(52) U.S. Cl.
CPC ........ *G01R 31/3658* (2013.01); *H01M 10/48* (2013.01); *H01M 10/486* (2013.01);
(Continued)

(58) Field of Classification Search
CPC .............. G01R 31/362; G01R 19/0092; G01R 31/3662; G01R 31/3679; G01R 31/3606;
(Continued)

(56) References Cited

U.S. PATENT DOCUMENTS 8,525,477 B2    9/2013   Zeng
8,571,738 B1   10/2013   Potter
(Continued)

FOREIGN PATENT DOCUMENTS

DE      102011002632      7/2012
DE      102012215208      3/2014
(Continued)

OTHER PUBLICATIONS

German Search Report for German Application No. 102015111015. 6, dated Mar. 7, 2016 with partial translation.
(Continued)

*Primary Examiner* — Jermele M Hollington
*Assistant Examiner* — Taqi Nasir
(74) *Attorney, Agent, or Firm* — RatnerPrestia

(57) ABSTRACT

A method for locating a battery module among multiple battery modules of a traction battery that are electrically connected to one another, having the following features: an electrical potential is measured at each of the battery modules in real time relative to a potential reference that is common to the battery modules; the potentials are used to subtractively compute voltages between the battery modules; a positional relationship for the battery modules is derived from the voltages; a module controller that is univocally denoted within the traction battery is used to retrieve a voltage dropped across the battery module that is to be located; and the retrieved voltage and the computed voltages are used to locate the battery module on the basis of the positional relationship within the traction battery. Also described is a corresponding apparatus, a corresponding computer program and a corresponding storage medium.

10 Claims, 2 Drawing Sheets

(51) Int. Cl.
*H01M 10/48* (2006.01)
*G01R 31/02* (2006.01)
*H01M 10/42* (2006.01)

(52) U.S. Cl.
CPC .......... *G01R 31/025* (2013.01); *G01R 31/362* (2013.01); *H01M 2010/4271* (2013.01); *H01M 2010/4278* (2013.01); *Y02T 90/124* (2013.01)

(58) Field of Classification Search
CPC ........................ G01R 1/203; G01R 31/3651; G01R 31/3624; G01R 31/3648
USPC .... 324/426, 430, 432, 433, 431, 127, 117 R, 324/126; 702/63
See application file for complete search history.

(56) References Cited

U.S. PATENT DOCUMENTS

| | | | |
|---|---|---|---|
| 2001/0009371 A1* | 7/2001 | Podrazhansky | G01R 31/362 324/432 |
| 2003/0137319 A1* | 7/2003 | Furukawa | B60L 3/0023 324/426 |
| 2007/0182418 A1* | 8/2007 | Reynier | H01M 6/50 324/429 |
| 2010/0182154 A1 | 7/2010 | Kawai | |
| 2010/0250043 A1 | 9/2010 | Scheucher | |
| 2010/0308834 A1* | 12/2010 | Kawai | B60L 11/1861 324/433 |
| 2011/0175574 A1 | 7/2011 | Sim et al. | |
| 2012/0244398 A1 | 9/2012 | Youngs | |
| 2012/0316812 A1* | 12/2012 | Umeki | G01R 31/3624 702/63 |
| 2013/0099731 A1* | 4/2013 | Schaefer | B60L 3/0069 320/108 |
| 2013/0158917 A1* | 6/2013 | Uchida | G01R 31/3658 702/63 |
| 2014/0045004 A1 | 2/2014 | Butzmann | |
| 2014/0062385 A1 | 3/2014 | Gaebler | |
| 2014/0272500 A1 | 9/2014 | Roumi | |

FOREIGN PATENT DOCUMENTS

| | | |
|---|---|---|
| EP | 2189322 A2 | 5/2010 |
| JP | 2003114243 A | 4/2003 |
| JP | 2010124617 A | 6/2010 |
| JP | 2011034964 A | 2/2011 |
| JP | 2012098212 A | 5/2012 |

OTHER PUBLICATIONS

English translation of Japanese Office Action for Application No. 2016-134921, dated Apr. 19, 2017, 8 pages.
English translation of the Korean Office Action for Application No. 10-2016-0085902, dated Jan. 5, 2018, 9 pages.

* cited by examiner

METHOD AND APPARATUS FOR LOCATING A BATTERY MODULE AMONG MULTIPLE BATTERY MODULES OF A TRACTION BATTERY THAT ARE ELECTRICALLY CONNECTED TO ONE ANOTHER

CROSS-REFERENCE TO RELATED APPLICATIONS

This application claims priority to German Patent Application No. DE 10 2015 111 015.6, filed Jul. 8, 2015, which is incorporated by reference herein in its entirety.

FIELD OF THE INVENTION

The present invention relates to a method for locating a battery module among multiple battery modules of a traction battery that are electrically connected to one another.

Furthermore, the present invention relates to a corresponding apparatus, a corresponding computer program and also a corresponding storage medium.

BACKGROUND OF THE INVENTION

Control systems are known for the modules of a traction battery in an electrically driven vehicle. In this case, each module can have a module controller that monitors data such as temperature and voltage for the individual cells and sends these values to a central battery controller via a bus system.

When module controllers communicate with the battery controller, they can use a univocal address, identification (ID) or code. This address, ID or code may be firmly and univocally associated with one module location and of such univocal design that no two module controllers having the same address, ID or code can arise in a bus of the battery controller in a vehicle. By way of example, known solutions achieve this with an address that is univocal among all existing or produced modules; a valid example can be the MAC address in computer networks.

US 2010 0182 154 A1, which is incorporated by reference herein, describes a battery control system in which each battery module has a module controller that ascertains cell data such as voltage and temperature and sends said cell data to a central battery controller via a bus system. A second bus system is used by the individual controllers to send ID information to the battery controller. The combination of the data and the ID information is used to ascertain the installation location of a module.

US 2014 0272 500 A1, which is incorporated by reference herein, describes the possibility of ascertaining the defective location of battery modules by means of their electromagnetic activity. In this case, the aim is for controllers at the modules to ascertain the electromagnetic activity and to use a bus system to forward said electromagnetic activity to a central battery controller.

US 2010 0250 043 A1, which is incorporated by reference herein, describes a rechargeable battery system. In particular, it discusses the measurement of individual cell data such as temperature and voltage.

US 2012 0244 398 A1, which is incorporated by reference herein, describes a battery system in which individual module controllers are connected via a bus system and can interchange data with one another.

US 2014 0045 004 A1, which is incorporated by reference herein, discloses a battery control system in which each module has a controller on it that measures the voltage of the module and sends said voltage to a central battery controller via a bus system.

US 2014 0062 385 A1, which is incorporated by reference herein, describes a battery security system that is intended to report unauthorized access to a battery module. For this purpose, each battery module is fitted with a monitoring unit that sends information to a central control unit via a bus system.

SUMMARY OF THE INVENTION

The invention relates to the insight that an unproblematic change of individual cell modules of the battery controllers requires any other central controller of the vehicle or the on-board diagnostics (OBDC or OBD) to identify the module. Particularly if the battery controller detects a problem, a failure or any other event in a cell module, this cell module needs to be identified and replaced. A conventional battery controller can link the problem to an address, identification or code of the cell module but not to the installation location.

Described herein is a method for locating a battery module among multiple battery modules of a traction battery that are electrically connected to one another, a corresponding apparatus, a corresponding computer program and also a corresponding storage medium.

According to aspects of the invention, the address, ID or code of the cell module therefore specifies the installation location. This requires the modules to be neither—electronically or mechanically, for example in order to prevent incorrect installation in the battery—individual for each installation location in the battery, which would lead to a large number of different components and small quantities, or individually programmed in an intricate manner following assembly so that the installation location of the respective module can be collated with a correspondingly associated address, ID or code.

To this end, each cell module—that is to say the electronics thereof—assigns its own electrical position in the complex of all the cell modules, or a central controller assigns an electrical position of the associated cell module, to each address, ID or code. Hence, the physical location in the battery box is also known, without there ever being the need for elaborate collation—for example as a table—to take place between cell module address, ID or code and the relevant physical position in the battery. However, there would then be a need for a fault-prone high voltage cable to be routed transversely through the battery to each cell module for measurement of the electrical potential of the respective cell module. The high voltage that said cell module takes in comparison with the conductors of the communication bus in the battery, for example, but also in comparison with any battery connection, can lead to installation faults and shorts.

The electrical position can be established, according to aspects of the invention, by measuring the electrical potential of the negative pole of the battery, for example. More generally, it is also possible for the electrical potential of any point in the circuit—provided that said point is not produced using a voltage transformer that generates higher voltages than the cell module voltage—to be measured, since each cell module spans a fixed potential range that does not normally overlap that of other cell modules.

In this case, however, it should be noted that generally the high voltage system and hence also the battery module are DC isolated from the remainder of the battery. The common reference point for measurement of the electrical potentials of each module is therefore definitive.

A person skilled in the art could be tempted to provide each cell module with an electrical potential reference point via a line that is connected to the negative pole of the whole battery, for example. This would produce a reference from the battery itself and get around the problem of DC isolation from the low voltage system. However, it would then be necessary for a fault-prone high voltage cable to be routed transversely through the battery to each cell module for measurement of the electrical potential of the respective cell module. In the case of the uppermost battery, the voltage occasionally reaches as much as 800 V.

The dangers of such an approach are advantageously avoided by the invention. In particular, the invention dispenses with an additional high voltage line in which conceivable insulation damage could lead to serious accidents and bring about the initiation of arcs.

BRIEF DESCRIPTION OF THE DRAWINGS

An exemplary embodiment of the invention is shown in the drawings and is described in more detail below.

DETAILED DESCRIPTION OF THE INVENTION

Figure 1:
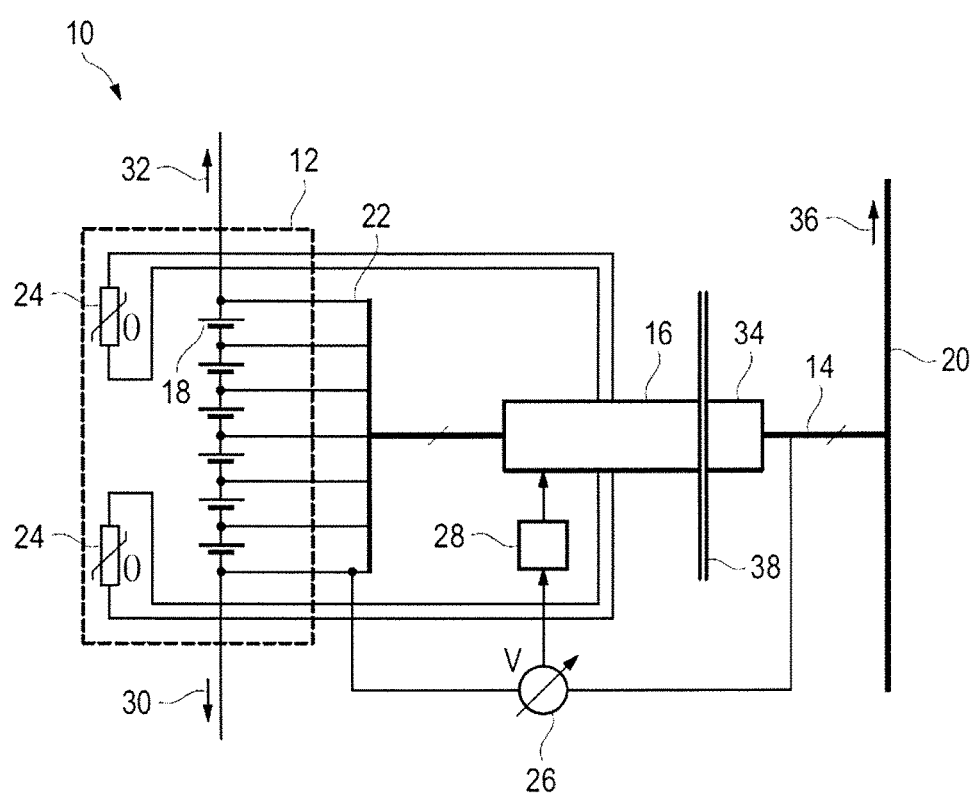
FIG. 1 shows the simplified circuit diagram according to a first embodiment of the invention.

The not unproblematic measurement of the electrical potential of each cell module can be accomplished according to aspects of the invention in multiple ways, the first of which will now be examined with reference to FIG. 1. By way of example, FIG. 1 shows just a single battery module 12, which is connected to the previous module 30 and the next module 32 via high voltage lines, however.

In this arrangement, the invention makes use of the circumstance that despite the DC isolation in a typical traction battery 10, there is at least capacitive coupling to the low voltage side on which, by way of example, the low voltage onboard power supply system is operated and particularly also the bus system 20 that provides the communication from each battery module 12 equipped with appropriate bus transceiver 34 to battery controllers and/or other modules 36.

Since, according to aspects of the invention, all the electrical potential measurements are carried out essentially simultaneously, a wide variety of points of the low voltage side provide a sufficient electrical potential reference 14 in this case.

The voltage between the battery modules 12 can be ascertained in the next step by means of pair-by-pair subtraction of the electrical potentials of all the battery modules 12. Battery modules 12 whose voltage values form the smallest difference can be regarded in a first approximation as also electrically directly adjacent.

In addition, the module controller 16 or the battery controller normally uses appropriate measurement lines 22 and temperature sensors 24 to also measure temperature and voltage for all the individual cells 18 and, together with the potential information, can ascertain the electrical interconnection of the battery modules 12 exactly.

This potential measurement can be performed by each battery module 12 itself for its own potential, and said battery module can electronically interchange the value with the other battery modules 12 and/or send it to the battery controller.

Since exactly simultaneous measurement particularly under the conditions that can be encountered in vehicle engineering is not always desirable or cannot always be adhered to, a low-pass filter 28 is preferably used that smoothes the voltage difference between the electrical potential of the battery module and the reference potential 14 on the low voltage side with a slow time constant, so that the aforementioned simultaneity condition is softened or becomes completely irrelevant.

A definitive aspect for the implementation is the choice of reference potential: since a typical traction battery 10 intentionally has few electrical parts of the low voltage network available, even the bodywork is intentionally shielded and a separate electrical line at reference potential is problematic, this choice proves essential to the invention.

Commercially available battery modules 12 normally have a DC potential isolation 38. In rare cases, it is situated closer to the battery controller. At this potential isolation 38, the electronic bus system 20 for communication with other battery modules 12 and/or with the battery controller encounters the respective battery module 12. At this location, it is advantageously possible to implement measurement of the potential of the battery module 12 against that of the bus system 20.

Figure 2:
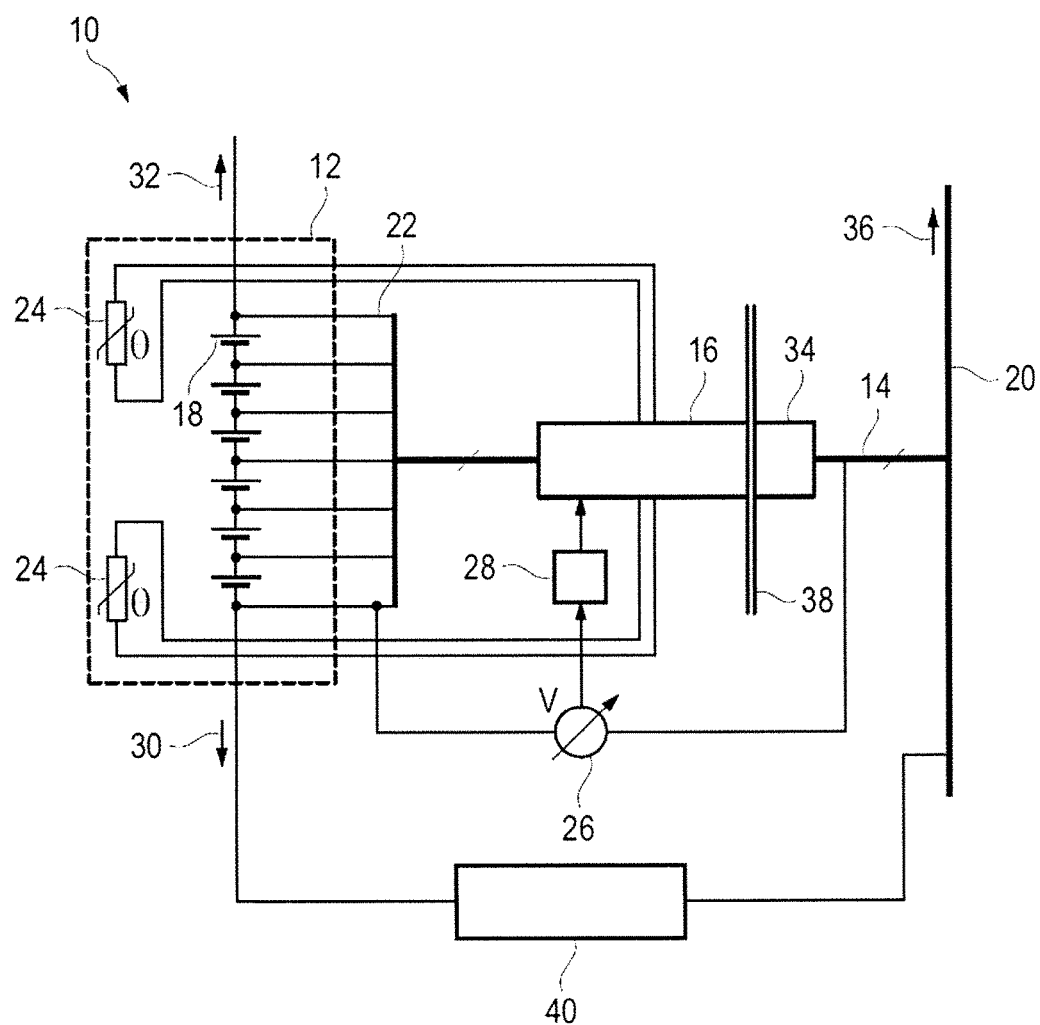
FIG. 2 shows a circuit diagram according to a second embodiment of the invention.

FIG. 2 illustrates a particularly advantageous embodiment of the invention that makes use of the circumstance that in numerous electric vehicles a ground leakage monitor 40 continuously monitors whether there is a conductive connection between the or multiple high voltage systems and the low voltage side—for example represented by the bodywork—and hence the potential isolation 38 is damaged. Contrary to an obvious misconception, commercially available ground leakage monitors 40 occasionally remove the assumed DC isolation to the extent that the measurement for the purposes of the invention is made possible, however.

Many ground leakage monitors 40 use one of the two principles below, both of which allow measurement of the potential according to aspects of the invention:

As one option, the ground leakage monitor 40 sets up a fixed—but extremely high-impedance and hence normally undetected—potential link between high voltage parts and low voltage parts and identifies a breach in the potential isolation 38 by virtue of the circumstance that the ground leakage monitor 40 would have to provide current in order to maintain this potential link. This potential link can also vary over time, for example follow a sinusoidal profile. More often, the low voltage parts are, by contrast, kept close to the middle of the potentials of the high voltage side with great stability over time.

Alternatively, the ground leakage monitor 40 can allow a very small current to flow from the low voltage side to the high voltage side and/or back, normally in a manner that varies over time, and can measure the potential link in order to check whether there is a conductive connection between the two.

In both cases, the ground leakage monitor 40 produces the stable potential reference 14 for the measurement according to aspects of the invention. In particular, the potential of the bus system 20 is therefore also defined, which is a preferred potential reference 14 for the measurement.

Regardless of the choice of potential reference 14, the following considerations apply for the proposed measurement:

Since A/D inputs of the module controller 16, which inputs may be used for this purpose, do not permit high voltages and it is also not permitted for the potential isolation 38 of the battery modules 12 from the low voltage part to be circumvented, the electrical potential of a battery module 12 can be measured in multiple ways.

By way of example, a resistor divider is used to lower the difference voltage between the potential and the potential reference 14 to a low voltage value. So that the resistor divider does not trigger a ground leakage monitor 40, it should be of such high-impedance design that all parallel-path currents from all the potential measurements on individual cells 18 of the battery modules 12 are much smaller than the trigger current threshold of the ground leakage monitor 40.

Advantageously, an isolation amplifier or an analog signal splitter is used for the measurement. This allows the DC isolation to be maintained.

In addition, a low-pass filter 28 is advisable, since the large currents in the traction battery 10 mean that electromagnetic interference can be very high.

If, additionally, the electrical bus system 20, which is actually used for communication with the other battery modules 12 and/or with the battery controller, is used as potential reference 14, then the following aspects should be borne in mind:

Normally, said bus system is a differential bus system 20 having at least two lines to reduce interference.

Preferably, not just one line of the bus system 20 should be used, but rather the mean value for all the lines should be formed and used as potential reference 14.

Since the information about the respective electrical potential of each battery module 12 is sent from the battery module 12, together with its own address, ID, code or the like and normally the voltages of the individual cells 18, to the battery controller and/or to other controllers, such as the OBD unit, for example, this unit also knows the respective potentials and the association with the addresses, IDs or codes. The information about the potentials can be used to ascertain the complete electrical wiring of the power part.

Since the electrical wiring of the power part in the traction battery 10 is prescribed by the design of the traction battery 10, the physical position of the battery modules 12 with determined addresses, IDs or codes is known without complex manual collation of a table of addresses, IDs or codes with the physical locations of the battery modules 12 ever having been performed.

Since the information about the voltages of the individual cells 18 and about the potentials can be combined, it is additionally possible to ascertain inconsistencies. By way of example, the potential of a battery module 12 can indicate a marked discrepancy. Since the potentials of the remainder of the battery modules 12 ought to be distributed approximately uniformly, and equidistantly, over the voltage of the whole traction battery 10, however, it is possible to identify a discrepancy that is significantly above the voltages of the individual cells 18.

In addition, the information about the time can be recorded. Since, on first switch-on and performance of position detection, the positions are known and there is no need to assume that, without the vehicle being opened, there is another position, it is additionally even possible to detect errors in individual cells 18 of the battery modules 12 if a plurality of voltage sensors fail.

Preferably, this involves ascertainment of the electrical potential of the electrically most negative point in the interconnected individual cells 18 in a battery module 12. Said most negative point, normally likewise the negative pole of the respective battery module 12, is also used as ground potential for each module controller 16 integrated in the battery module 12 in a typical traction battery 10.

Alternatively, it would also be possible to use any other point, for example taps on one of the individual cells 18, since each battery module 12 comprises a dedicated particular potential range that normally does not match the specific potential ranges of the adjacent battery modules 12.

What is claimed is:

1. A method for locating a battery module among multiple battery modules of a traction battery that are electrically connected to one another, said method comprising:
measuring an electrical potential at each of the battery modules in real time relative to a potential reference that is common to the battery modules,
subtractively computing potentials between the battery modules using the measured electrical potentials,
deriving a positional relationship for the battery modules from the subtractively computed potentials,
retrieving a voltage dropped across the battery module that is to be located using a module controller that is univocally denoted within the traction battery, and
locating the battery module on the basis of the positional relationship within the traction battery using the retrieved voltage and the substractively computed potentials.

2. The method as claimed in claim 1, wherein the battery modules each comprise multiple individual electrical cells and the voltage dropped across the battery module is retrieved by retrieving the voltage from each individual cell of the battery module using the module controller.

3. The method as claimed in claim 1, wherein the module controller is one of multiple module controllers, each associated with a battery module, that are connected for signaling purposes via a bus system of the traction battery, and the bus system defines the potential reference.

4. The method as claimed in claim 3, wherein the bus system connects the battery modules additionally to a battery controller of the traction battery, and wherein the battery controller controls (i) computation of the voltages, (ii) derivation of the positional relationship, (iii) retrieval of the voltage or the location of the battery module.

5. The method as claimed in claim 3, wherein the potential is measured by a voltmeter associated with the respective battery module, and the voltmeter reports the potential to the respective module controller via a low-pass filter.

6. The method as claimed in claim 3, wherein a ground leakage monitor monitors a DC potential isolation between the battery module and the bus system, and the ground leakage monitor defines the potential reference.

7. The method as claimed in claim 1, wherein the positional relationship of the battery modules is stored and is retrieved as required in order to locate a further battery module among the battery modules.

8. A computer program that is configured to perform all the steps of the method as claimed in claim 1.

9. A machine-readable storage medium having the computer program as claimed in claim 8 stored thereon.

10. An apparatus for locating a battery module among multiple battery modules of a traction battery that are electrically connected to one another, said apparatus comprising:
means for measuring an electrical potential at each of the battery modules relative to a potential reference that is common to the multiple battery modules, means for subtractively computing potentials between the battery modules from the measured electrical potentials, means for deriving a positional relationship for the battery modules from the subtractively computed potentials, means for retrieving a voltage dropped across a battery module that is to be located among the battery modules using a module controller that is univocally denoted within the traction battery, and means for locating the battery module on the basis of the positional relationship within the traction battery using the retrieved voltage and the subtractively computed potentials.

* * * * *